US009256245B2

(12) United States Patent
Chiang et al.

(10) Patent No.: US 9,256,245 B2
(45) Date of Patent: Feb. 9, 2016

(54) CLOCK TREE CIRCUIT AND MEMORY CONTROLLER

(71) Applicant: MediaTek Inc., Hsin-Chu (TW)

(72) Inventors: Chen-Feng Chiang, Xingang Township, Chiayi County (TW); Kai-Hsin Chen, Changhua (TW); Ming-Shi Liou, Taipei (TW); Chih-Tsung Yao, Zhubei (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 14/602,562

(22) Filed: Jan. 22, 2015

(65) Prior Publication Data

US 2015/0286243 A1    Oct. 8, 2015

Related U.S. Application Data

(60) Provisional application No. 61/973,988, filed on Apr. 2, 2014.

(51) Int. Cl.
*G11C 7/00* (2006.01)
*G06F 1/10* (2006.01)
*G11C 11/4076* (2006.01)
*G11C 11/4094* (2006.01)

(52) U.S. Cl.
CPC ............. *G06F 1/10* (2013.01); *G11C 11/4076* (2013.01); *G11C 11/4094* (2013.01)

(58) Field of Classification Search
CPC ........................................................ G11C 7/00
USPC ....................................... 365/189.011–225.7
See application file for complete search history.

(56) References Cited

U.S. PATENT DOCUMENTS

| 6,374,393 | B1 * | 4/2002 | Hirairi ................. | G11C 7/1006 716/111 |
| 7,562,329 | B2 * | 7/2009 | Matsubara .......... | G06F 17/5077 716/122 |
| 2005/0235239 | A1 * | 10/2005 | Matsubara .......... | G06F 17/5077 257/48 |

* cited by examiner

*Primary Examiner* — Harry W Byrne
(74) *Attorney, Agent, or Firm* — McClure, Qualey & Rodack, LLP

(57) ABSTRACT

A clock tree circuit includes a clock source and a tree circuit. The clock source generates a signal. The tree circuit at least includes five driving units and a metal connection element. A first driving unit has an input terminal for receiving the signal, and an output terminal coupled to a first node. A second driving unit has an input terminal coupled to the first node, and an output terminal coupled to a second node. A third driving unit has an input terminal coupled to the first node, and an output terminal coupled to a third node. A fourth driving unit has an input terminal coupled to the second node. A fifth driving unit has an input terminal coupled to the third node. The metal connection element is coupled between the second node and the third node, and configured as a short-circuited element.

23 Claims, 7 Drawing Sheets

CLOCK TREE CIRCUIT AND MEMORY CONTROLLER

CROSS REFERENCE TO RELATED APPLICATIONS

This application claims the benefit of U.S. Provisional Application No. 61/973,988, filed on Apr. 2, 2014, the entirety of which is incorporated by reference herein.

BACKGROUND OF THE INVENTION

1. Field of the Invention

The disclosure generally relates to a clock tree circuit, and more particularly, to a clock tree circuit for reducing clock skew and clock jitter.

2. Description of the Related Art

Clock tree circuits are commonly used in the field of digital circuit design. However, since driving paths in clock tree circuits often have different lengths, they tend to result in clock skew and/or clock jitter and degrade the performance of the clock tree circuits. The different lengths of driving paths may also be caused by on-chip variation (OCV), which is unpredictable and uncontrollable. Accordingly, there is a need to design a novel clock tree circuit to solve the above problem.

BRIEF SUMMARY OF THE INVENTION

In a preferred embodiment, the disclosure is directed to a clock tree circuit, including: a first clock source, generating a first signal; and a first tree circuit, including: a first driving unit, wherein the first driving unit has an input terminal for receiving the first signal, and an output terminal coupled to a first node; a second driving unit, wherein the second driving unit has an input terminal coupled to the first node, and an output terminal coupled to a second node; a third driving unit, wherein the third driving unit has an input terminal coupled to the first node, and an output terminal coupled to a third node; a fourth driving unit, wherein the fourth driving unit has an input terminal coupled to the second node, and an output terminal; a fifth driving unit, wherein the fifth driving unit has an input terminal coupled to the third node, and an output terminal; and a metal connection element, coupled between the second node and the third node, and configured as a short-circuited element.

In some embodiments, the metal connection element is configured to reduce clock skew and clock jitter in the first tree circuit. In some embodiments, the first tree circuit further includes: a sixth driving unit, wherein the sixth driving unit has an input terminal coupled to the second node, and an output terminal; and a seventh driving unit, wherein the seventh driving unit has an input terminal coupled to the third node, and an output terminal. In some embodiments, the first driving unit, the second driving unit, the third driving unit, the fourth driving unit, the fifth driving unit, the sixth driving unit, and the seventh driving unit are implemented with buffers and/or inverters. In some embodiments, a width of the metal connection element is from 2 to 10 times greater than a minimum metal width in a process for manufacturing the clock tree circuit. In some embodiments, the first tree circuit further includes: one or more metal shielding elements, disposed adjacent to the metal connection element. In some embodiments, spacing between the metal connection element and each metal shielding element is from 2 to 10 times greater than a minimum metal width in a process for manufacturing the clock tree circuit. In some embodiments, the first tree circuit further includes: a plurality of additional metal shielding elements; and a plurality of via elements, wherein the additional metal shielding elements are coupled through the via elements to the metal shielding elements, so as to form a closed loop structure for surrounding the metal connection element. In some embodiments, the clock tree circuit further includes: a first independent power source, supplying a part or a whole of the first tree circuit. In some embodiments, the clock tree circuit is applied to a memory device, and the first signal outputted by the first clock source is a data strobe signal (DQS). In some embodiments, the clock tree circuit further includes: a second clock source, generating a second signal; and a second tree circuit, disposed adjacent to the first tree circuit, and receiving the second signal, wherein the second tree circuit is similar or identical to the first tree circuit. In some embodiments, the clock tree circuit further includes: a first independent power source, supplying a part or a whole of the first tree circuit; and a second independent power source, supplying a part or a whole of the second tree circuit.

In another preferred embodiment, the disclosure is directed to a memory controller, including: a first tree circuit, including: a first driving unit, wherein the first driving unit has an input terminal for receiving a first data strobe signal (DQS), and an output terminal coupled to a first node; a second driving unit, wherein the second driving unit has an input terminal coupled to the first node, and an output terminal coupled to a second node; a third driving unit, wherein the third driving unit has an input terminal coupled to the first node, and an output terminal coupled to a third node; a fourth driving unit, wherein the fourth driving unit has an input terminal coupled to the second node, and an output terminal; a fifth driving unit, wherein the fifth driving unit has an input terminal coupled to the third node, and an output terminal; and a metal connection element, coupled between the second node and the third node, and configured as a short-circuited element; and a plurality of first transceivers, transmitting or receiving a plurality of first bits, wherein the first transceivers are driven by the first tree circuit.

In some embodiments, the memory controller further includes: a second tree circuit, disposed adjacent to the first tree circuit, and receiving a second data strobe signal (DQS), wherein the second tree circuit is similar or identical to the first tree circuit; and a plurality of second transceivers, transmitting or receiving a plurality of second bits, wherein the second transceivers are driven by the second tree circuit.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

In order to illustrate the purposes, features and advantages of the invention, the embodiments and figures of the invention are disclosed in detail as follows.

Figure 1:
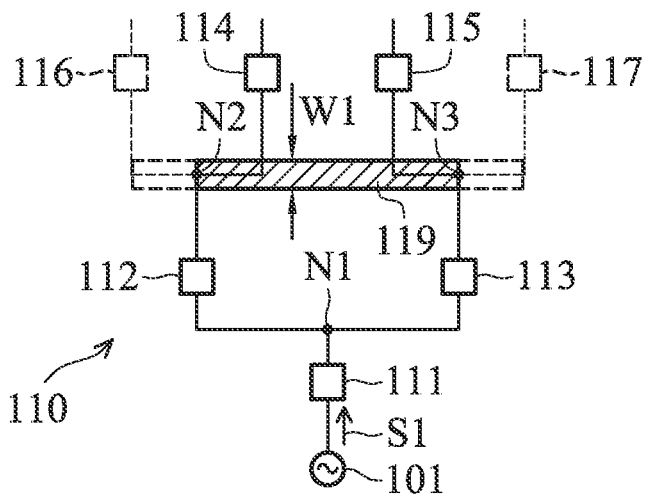
FIG. 1 is a diagram of a clock tree circuit according to an embodiment of the invention.

FIG. 1 is a diagram of a clock tree circuit 100 according to an embodiment of the invention. As shown in FIG. 1, the clock tree circuit 100 at least includes a first clock source 101 and a first tree circuit 110. The first clock source 101 is configured to generate a first signal S1. For example, the first signal S1 may be a normal clock signal. In alternative embodiments, when the clock tree circuit 100 is applied to a memory device or a memory controller, the first signal S1 outputted by the first clock source 101 may be a data strobe signal (DQS) for use in a sampling process.

The first tree circuit 110 at least includes a first driving unit 111, a second driving unit 112, a third driving unit 113, a fourth driving unit 114, a fifth driving unit 115, and a metal connection element 119. The first driving unit 111 has an input terminal for receiving the first signal S1, and an output terminal coupled to a first node N1. The second driving unit 112 has an input terminal coupled to the first node N1, and an output terminal coupled to a second node N2. The third driving unit 113 has an input terminal coupled to the first node N1, and an output terminal coupled to a third node N3. The fourth driving unit 114 has an input terminal coupled to the second node N2, and an output terminal. The fifth driving unit 115 has an input terminal coupled to the third node N3, and an output terminal. In some embodiments, the first tree circuit 110 further includes a sixth driving unit 116 and a seventh driving unit 117 (optional elements). The sixth driving unit 116 has an input terminal coupled to the second node N2, and an output terminal. The seventh driving unit 117 has an input terminal coupled to the third node N3, and an output terminal. The first driving unit 111, the second driving unit 112, the third driving unit 113, the fourth driving unit 114, the fifth driving unit 115, the sixth driving unit 116, and the seventh driving unit 117 may be implemented with buffers and/or inverters according to different design requirements. Each buffer may be made by cascading two inverters. For example, a part of these driving units may be implemented with buffers so as to provide 0-degree clock phases, and the other driving units may be implemented with inverters so as to provide 180-degree clock phases. The first driving unit 111 may form a first driving stage of the first tree circuit 110. The second driving unit 112 and the third driving unit 113 may form a second driving stage of the first tree circuit 110. The fourth driving unit 114, the fifth driving unit 115, the sixth driving unit 116, and the seventh driving unit 117 (if the sixth driving unit 116 and the seventh driving unit 117 exist) may form a third driving stage of the first tree circuit 110. These driving stages can buffer (invert) the original first signal S1 and provide sufficient output driving currents for subsequent corresponding stages. For example, the output terminals of the third driving stage (i.e., the output terminals of the fourth driving unit 114, the fifth driving unit 115, the sixth driving unit 116, and the seventh driving unit 117) may be further coupled to a variety of next-stage circuits, such as functional circuits or next-stage driving units (not shown).

It should be noted that since the driving paths in the clock tree circuit 100 have different lengths, they tend to result in serious clock skew and/or clock jitter. For example, a first driving path may be formed from the first clock source 101 through the first node N1 to the second node N2, and a second driving path may be formed from the first clock source 101 through the first node N1 to the third node N3. There may be different clock phases at the second node N2 and the third node N3 because of the non-uniform lengths of the first and second driving paths. However, ideally, all output terminals of the same driving stage should have the same clock phase. In the invention, the metal connection element 119 is proposed and incorporated into the first tree circuit 110 so as to solve the problem. The metal connection element 119 is added and coupled between the second node N2 and the third node N3, and it is configured as a short-circuited element. Because the second node N2 and the third node N3 are tied together by the short-circuited metal connection element 119, the clock phases at the second node N2 and the third node N3 are unified and become consistent with each other. This effectively eliminates different path delay times and different clock phases at the output terminals of the second driving unit 112 and the third driving unit 113, and therefore solves the problem of clock skew and/or clock jitter in the clock tree circuit 100. In some embodiments, the width W1 of the metal connection element 119 is from 2 to 10 times greater than the minimum metal width in the process for manufacturing the clock tree circuit 100, such that the resistance of the metal connection element 119 is sufficiently low as a short-circuited element. Preferably, the width W1 of the metal connection element 119 may be from about 5 to 6 times greater than the minimum metal width. In alternative embodiments, if the sixth driving unit 116 and the seventh driving unit 117 are added, two ends of the metal connection element 119 may further extend and reach the input terminals of the sixth driving unit 116 and the seventh driving unit 117. Although there are merely three driving stages and seven driving units shown in FIG. 1, it should be understood that the invention is not limited thereto. In other embodiments, the first tree circuit 110 may include more driving stages and driving units, and more metal connection elements 119 may be added and coupled to the output terminals of driving units arranged in the same driving stage, so as to reduce the clock skew and/or clock jitter in the clock tree circuit 100.

Figure 2:
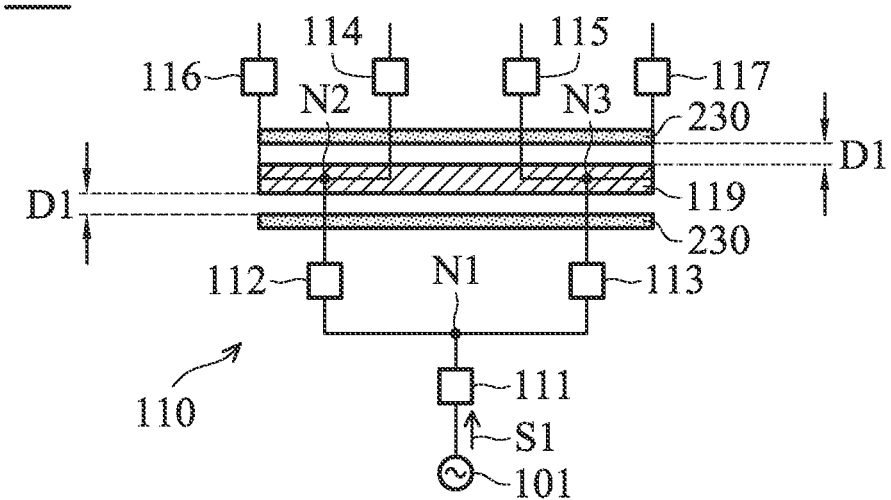
FIG. 2 is a diagram of a clock tree circuit according to an embodiment of the invention.

FIG. 2 is a diagram of a clock tree circuit 200 according to an embodiment of the invention. FIG. 2 is similar to FIG. 1. The difference from the embodiments of FIG. 1 is that the first tree circuit 110 of the clock tree circuit 200 further includes one or more metal shielding elements 230, which are disposed adjacent to the metal connection element 119. For example, the metal shielding elements 230 may be disposed on the left, the right, the top, or the bottom of the metal connection element 119. The metal shielding elements 230 are configured to suppress the crosstalk effect between the metal connection element 119 and other transmission lines. The first tree circuit 110 including the metal shielding elements 230 can generate pure and clear output signals for driving next-stage circuits. In some embodiments, the spacing D1 between the metal connection element 119 and each metal shielding element 230 is from 2 to 10 times greater than the minimum metal width in the process for manufacturing the clock tree circuit 200. Preferably, the spacing D1 may be from about 5 to 6 times greater than the minimum metal width. In some embodiments, the metal shielding elements 230 are further coupled to a ground voltage node or a power supply node (not shown). Other features of the clock tree circuit 200 of FIG. 2 are similar to those of the clock tree circuit 100 of FIG. 1. Accordingly, the two embodiments can achieve similar levels of performance.

Figure 3A:
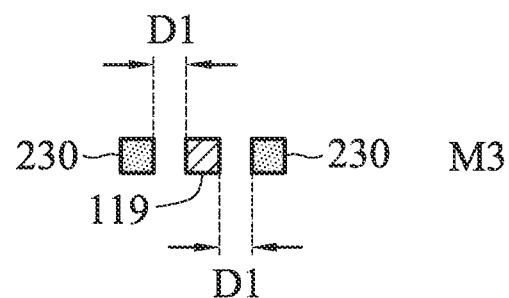
FIG. 3A is a cross-sectional view of a metal connection element and metal shielding elements according to an embodiment of the invention.
Figure 3B:
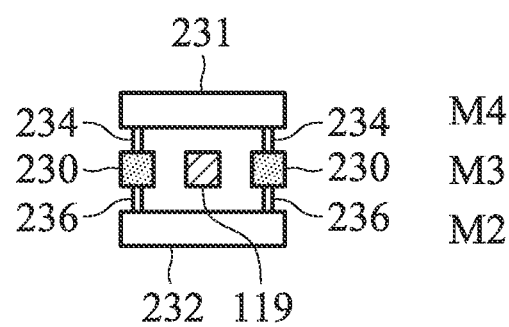
FIG. 3B is a cross-sectional view of a metal connection element and metal shielding elements according to an embodiment of the invention.

FIG. 3A is a cross-sectional view of the metal connection element 119 and the metal shielding elements 230 according to an embodiment of the invention. In the embodiment of FIG. 3A, the metal connection element 119 and the metal shielding elements 230 are formed on the same metal layer (M3), and the metal shielding elements 230 are disposed on the left and the right of the metal connection element 119. FIG. 3B is a cross-sectional view of the metal connection element 119 and the metal shielding elements 230 according to an embodiment of the invention. In the embodiment of FIG. 3B, additional metal shielding elements 231 and 232 are further included, and they are formed on different metal layers (M2 and M4) and disposed on the top and the bottom of the metal connection element 119, respectively. The additional metal shielding elements 231 and 232 may be further coupled through via elements 234 and 236 to the metal shielding elements 230, so as to form a closed loop structure for surrounding the metal shielding elements 230 and further reduce the crosstalk effect. It should be understood that the arrangements of FIGS. 3A and 3B are just exemplary, and they are not limitations of the invention.

Figure 4:
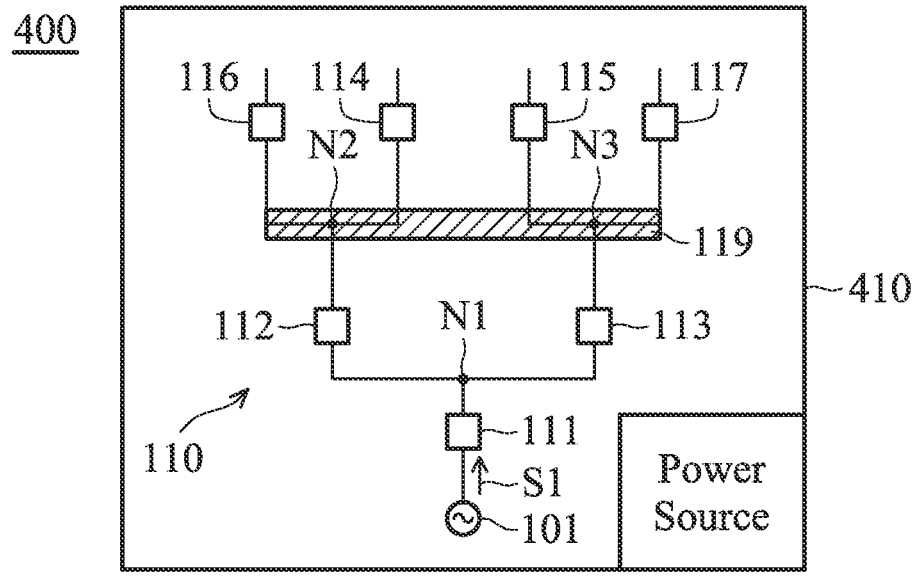
FIG. 4 is a diagram of a clock tree circuit according to an embodiment of the invention.

FIG. 4 is a diagram of a clock tree circuit 400 according to an embodiment of the invention. FIG. 4 is similar to FIG. 1. The difference from the embodiments of FIG. 1 is that the clock tree circuit 400 further includes a first independent power source 410. For example, the first independent power source 410 may be a low dropout regulator (LDO). The first independent power source 410 is configured to supply a part or a whole of the first tree circuit 110. For example, the first independent power source 410 may supply all of the driving units of the first tree circuit 110, or may only supply the fourth driving unit 114, the fifth driving unit 115, the sixth driving unit 116, and the seventh driving unit 117. The first independent power source 410 is different from the main power source (not shown), which supplies the circuits other than the first tree circuit 110. With such a design, the first tree circuit 110 is not affected by the other circuits or the main power source, and it can provide pure and clear output signals. Other features of the clock tree circuit 400 of FIG. 4 are similar to those of the clock tree circuit 100 of FIG. 1. Accordingly, the two embodiments can achieve similar levels of performance.

Figure 5:
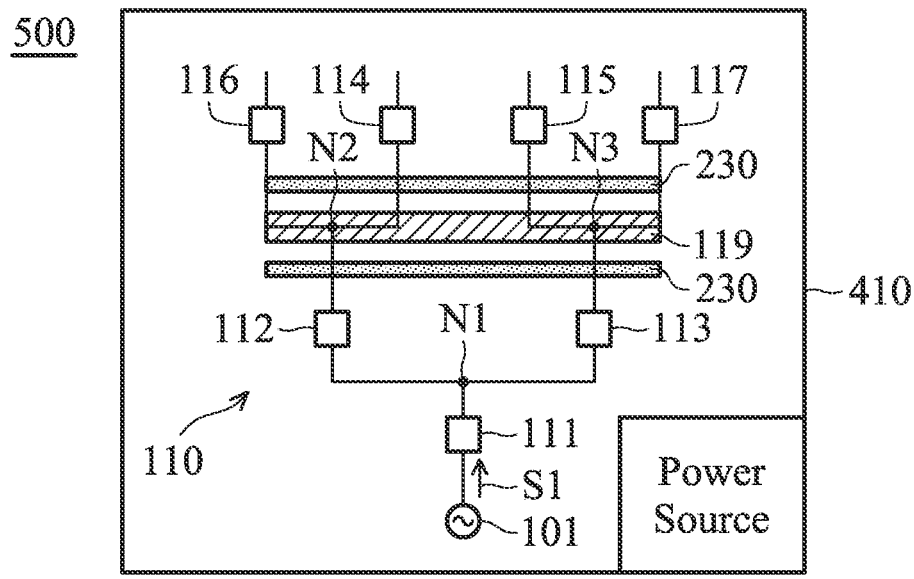
FIG. 5 is a diagram of a clock tree circuit according to an embodiment of the invention.

FIG. 5 is a diagram of a clock tree circuit 500 according to an embodiment of the invention. FIG. 5 is similar to FIG. 1. The difference from the embodiments of FIG. 1 is that the first tree circuit 110 of the clock tree circuit 500 further includes one or more metal shielding elements 230, and the clock tree circuit 500 further includes a first independent power source 410. Generally, the clock tree circuit 500 may be considered as a combination of the embodiments of FIG. 2 and FIG. 4, and it can further improve the quality of output signals. Other features of the clock tree circuit 500 of FIG. 5 are similar to those of the clock tree circuit 100 of FIG. 1. Accordingly, the two embodiments can achieve similar levels of performance.

Figure 6:
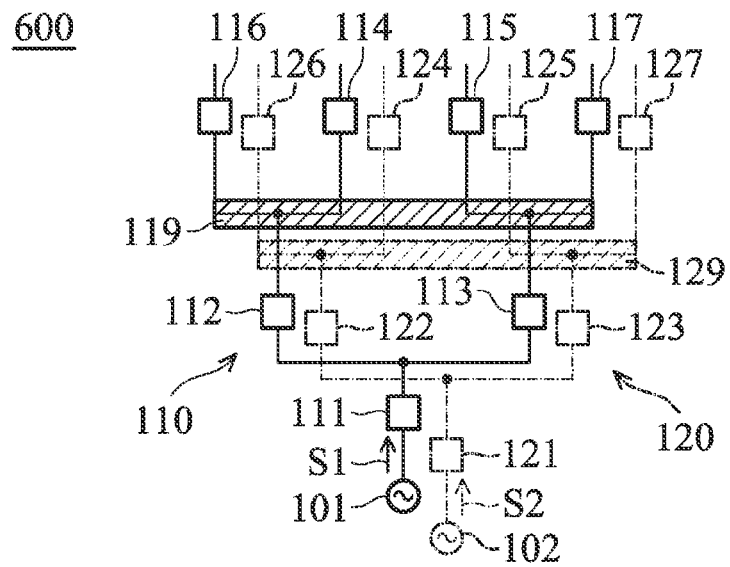
FIG. 6 is a diagram of a clock tree circuit according to an embodiment of the invention.

FIG. 6 is a diagram of a clock tree circuit 600 according to an embodiment of the invention. FIG. 6 is similar to FIG. 1. The difference from the embodiments of FIG. 1 is that the clock tree circuit 600 further includes a second clock source 102 and a second tree circuit 120. The second clock source 102 is configured to generate a second signal S2, which may be a normal clock signal or a data strobe signal (DQS). The phase of the second signal S2 may be the same as or different from that of the first signal S1. For example, the phase difference between the second signal S2 and the first signal S1 may be 0, 45, 90, 135, or 180 degrees. The second tree circuit 120 may include an eighth driving unit 121, a ninth driving unit 122, a tenth driving unit 123, an eleventh driving unit 124, a twelfth driving unit 125, a thirteenth driving unit 126, and a fourteenth driving unit 127 (the thirteenth driving unit 126 and the fourteenth driving unit 127 are optional). The second tree circuit 120 is disposed adjacent to the first tree circuit 110, and is arranged to receive the second signal S2 (e.g., the eighth driving unit 121 may have an input terminal for receiving the second signal S2) and drive next-stage circuits (not shown) accordingly. It should be understood that the inner structure of the second tree circuit 120 is similar or identical to that of the first tree circuit 110, and the aforementioned inner structure has been described in the embodiments of FIGS. 1-5. The first tree circuit 110 and the second tree circuit 120 can drive their respective next-stage circuits, which may be used to support similar functions. Other features of the clock tree circuit 500 of FIG. 5 are similar to those of the clock tree circuit 100 of FIG. 1. Accordingly, the two embodiments can achieve similar levels of performance.

Figure 7:
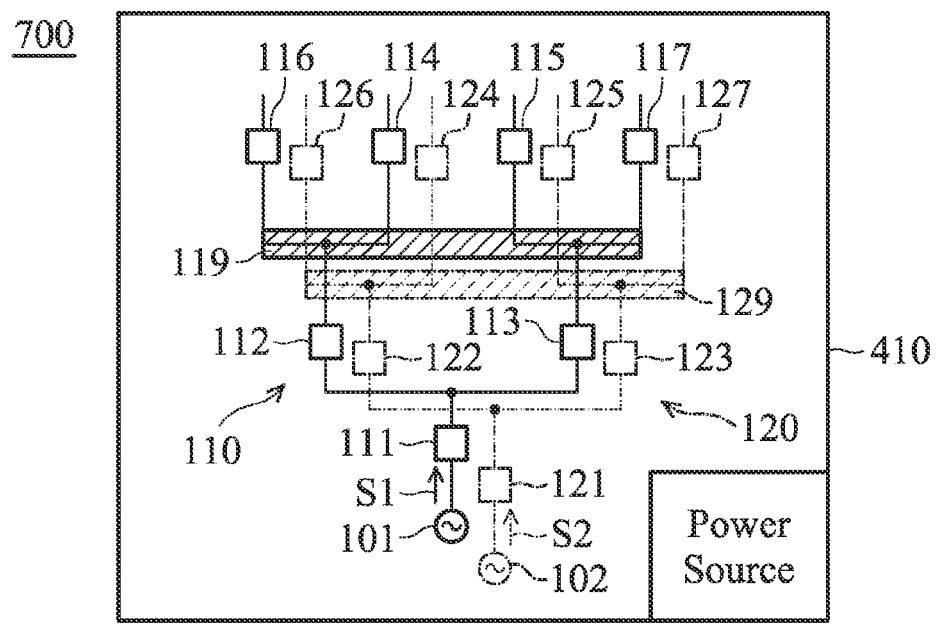
FIG. 7 is a diagram of a clock tree circuit according to an embodiment of the invention.

FIG. 7 is a diagram of a clock tree circuit 700 according to an embodiment of the invention. FIG. 7 is similar to FIG. 6. The difference from the embodiments of FIG. 6 is that the clock tree circuit 700 further includes a first independent power source 410. The first independent power source 410 is configured to supply a part or a whole of the first tree circuit 110 and the second tree circuit 120. For example, the first independent power source 410 may supply all of the driving units of the first tree circuit 110 and the second tree circuit 120, or may only supply the fourth driving unit 114, the fifth driving unit 115, the sixth driving unit 116, the seventh driving unit 117, the eleventh driving unit 124, the twelfth driving unit 125, the thirteenth driving unit 126, and the fourteenth driving unit 127. Other features of the clock tree circuit 700 of FIG. 7 are similar to those of the clock tree circuit 600 of FIG. 6. Accordingly, the two embodiments can achieve similar levels of performance.

Figure 8:
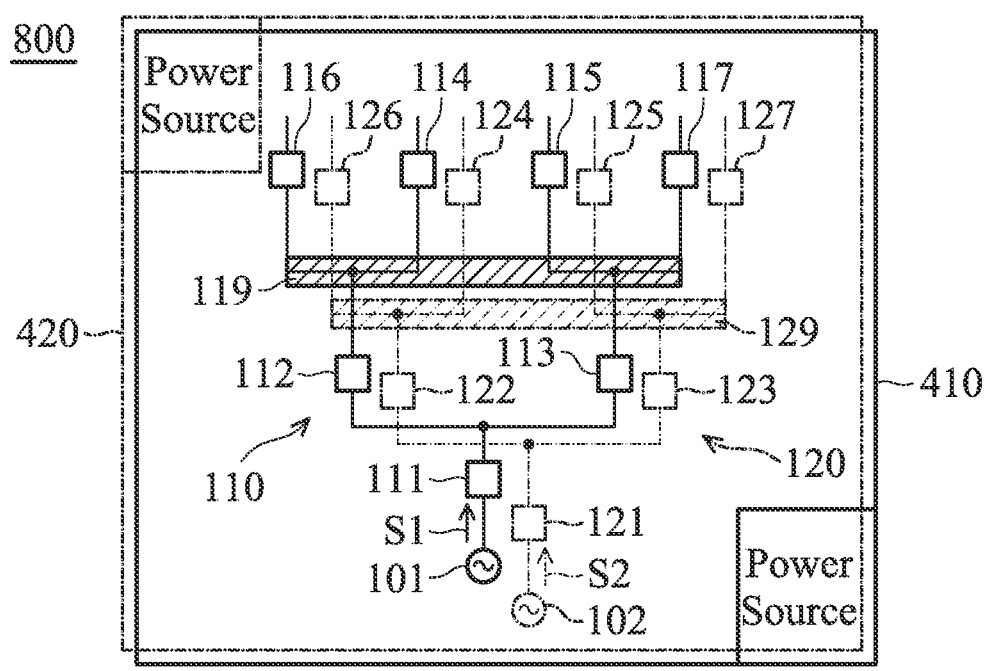
FIG. 8 is a diagram of a clock tree circuit according to an embodiment of the invention.

FIG. 8 is a diagram of a clock tree circuit 800 according to an embodiment of the invention. FIG. 8 is similar to FIG. 6. The difference from the embodiments of FIG. 6 is that the clock tree circuit 800 further includes a first independent power source 410 and a second independent power source 420. For example, the first independent power source 410 and the second independent power source 420 may be low dropout regulators. The first independent power source 410 and the second independent power source 420 may have the same or different supply voltages. The first independent power source 410 is configured to supply a part or a whole of the first tree circuit 110, and the second independent power source 420 is configured to supply a part or a whole of the second tree circuit 120. Other features of the clock tree circuit 800 of FIG. 8 are similar to those of the clock tree circuit 600 of FIG. 6. Accordingly, the two embodiments can achieve similar levels of performance.

In some embodiments, the first tree circuit 110 and the second tree circuit 120 of FIGS. 6-8 each include one or more metal shielding elements 230 described in the embodiments of FIGS. 2, 3A, and 3B, so as to further improve the quality of output signals.

Figure 9:
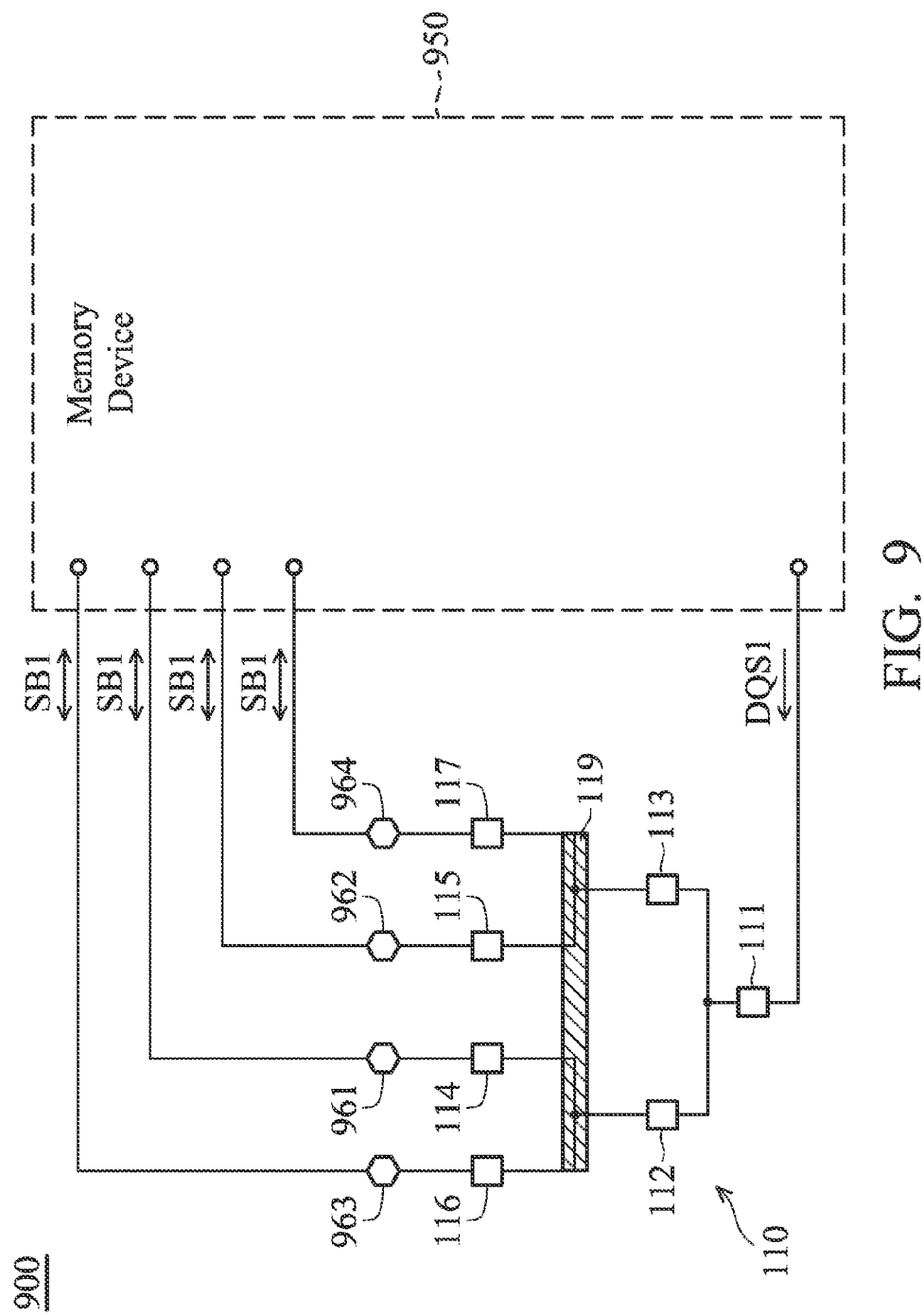
FIG. 9 is a diagram of a memory controller according to an embodiment of the invention.

FIG. 9 is a diagram of a memory controller 900 according to an embodiment of the invention. The memory controller 900 is configured to control a memory device 950, such as dynamic random-access memory (DRAM). As shown in FIG. 9, the memory controller 900 at least includes a first tree circuit 110 and multiple first transceivers 961, 962, 963, and 964. The inner structure of the first tree circuit 110 has been described in the embodiments of FIGS. 1-5. In the embodiment of FIG. 9, an input terminal of a first driving unit 111 of the first tree circuit 110 is arranged to receive a first data strobe signal (DQS) DQS1 from the memory device 950, and output terminals of a fourth driving unit 114, a fifth driving unit 115, a sixth driving unit 116, and a seventh driving unit 117 of the first tree circuit 110 are arranged to drive the first transceivers 961, 962, 963, and 964, respectively. More particularly, the operations of the first tree circuit 110 and the first transceivers 961, 962, 963, and 964 may be as follows. When performing a writing process, the first transceivers 961, 962, 963, and 964 transmit multiple first bits SB1 to the memory device 950 (e.g., to multiple DRAM cells). When performing a reading process, the first transceivers 961, 962, 963, and 964 receive multiple first bits SB1 from the memory device 950 (e.g., from multiple DRAM cells). The above writing and reading processes are performed according to the first data strobe signal DQS1, which are transmitted through the first tree circuit 110 from the memory device 950. The first data strobe signal DQS1 may be discontinuous and aperiodic, and it may be used as a clock signal for sampling the first bits SB1 in the writing and reading processes. For example, the first data strobe signal DQS1 may be outputted by the memory device 950 to the memory controller 900 only when the writing process or the reading process is performed. The first tree circuit 110 is used to buffer the first data strobe signal DQS1 and reduce clock skew and/or clock jitter in the memory controller 900. It should be understood that any one or more features of the embodiments of FIG. 1-5, including the metal connection elements, the metal shielding elements, and the independent power sources, may be applied to the memory controller 900 so as to improve its performance, and these detailed features will be not described again here.

Figure 10:
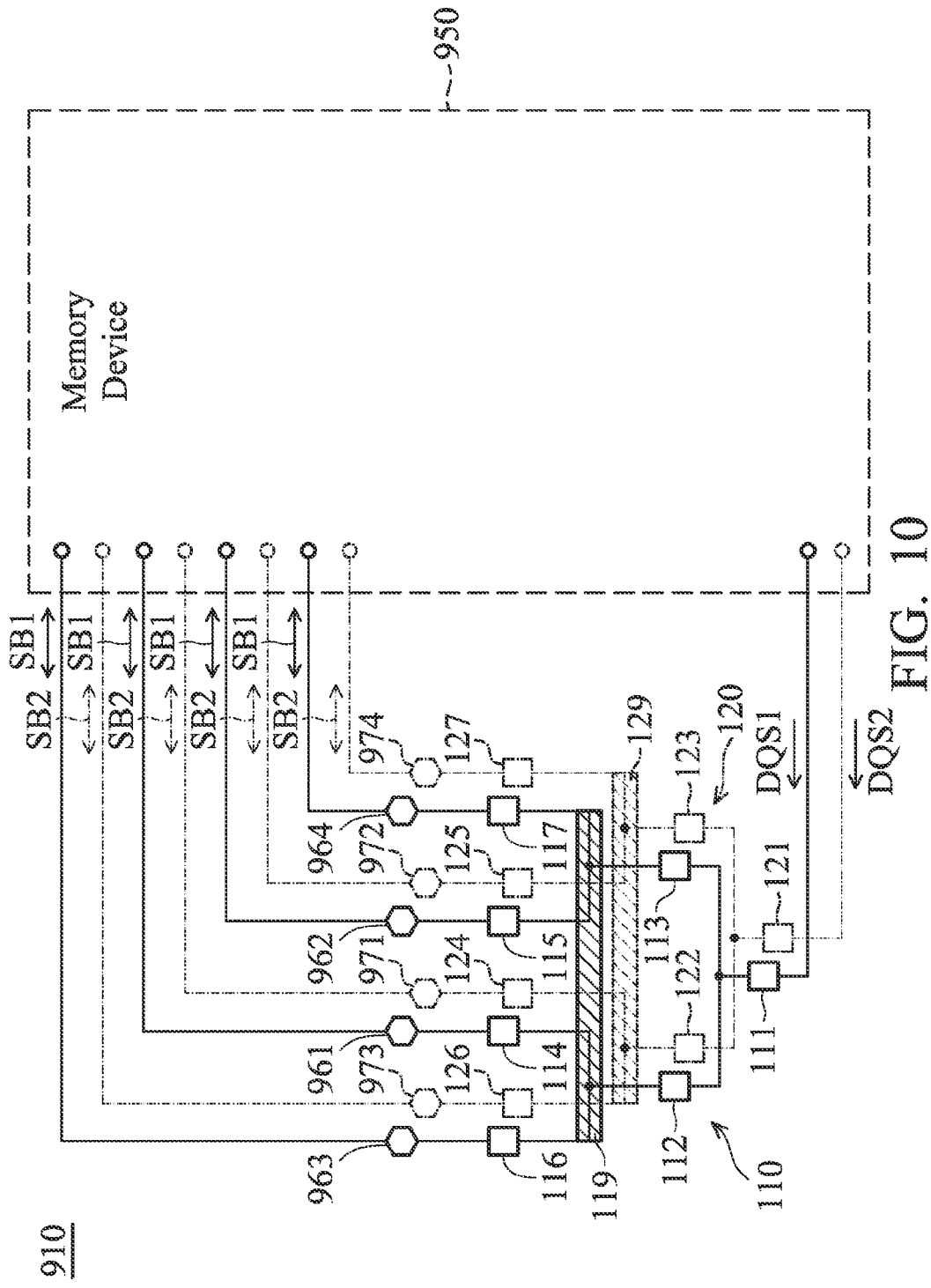
FIG. 10 is a diagram of a memory controller according to an embodiment of the invention.

FIG. 10 is a diagram of a memory controller 910 according to an embodiment of the invention. FIG. 10 is similar to FIG. 9. The difference from the embodiments of FIG. 9 is that the memory controller 910 further includes a second tree circuit 120 and multiple second transceivers 971, 972, 973, and 974. The second tree circuit 120 is disposed adjacent to the first tree circuit 110. The inner structure of the second tree circuit 120 is similar or identical to that of the first tree circuit 110. In the embodiment of FIG. 10, an input terminal of an eighth driving unit 121 of the second tree circuit 120 is arranged to receive a second data strobe signal (DQS) DQS2 from the memory device 950, and output terminals of an eleventh driving unit 124, a twelfth driving unit 125, a thirteenth driving unit 126, and a fourteenth driving unit 127 of the second tree circuit 120 are arranged to drive the second transceivers 971, 972, 973, and 974, respectively. When performing a writing process, the second transceivers 971, 972, 973, and 974 transmit multiple second bits SB2 to the memory device 950. When performing a reading process, the second transceivers 971, 972, 973, and 974 receive multiple second bits SB2 from the memory device 950. The above writing and reading processes are performed according to the second data strobe signal DQS2. The second data strobe signal DQS2 may be discontinuous and aperiodic, and it may be used as a clock signal for sampling the second bits SB2 in the writing and reading processes. The second data strobe signal DQS2 may be outputted by the memory device 950 to the memory controller 910 only when the writing process or the reading process is performed. The second tree circuit 120 is used to buffer the second data strobe signal DQS2 and reduce clock skew and/or clock jitter in the memory controller 910. It should be understood that any one or more features of the embodiments of FIG. 1-8, including the metal connection elements, the metal shielding elements, and the independent power sources, may be applied to the memory controller 910 so as to improve its performance, and these features will be not described again here.

Although there are merely four or eight transceivers shown in FIGS. 9 and 10, it should be understood that the invention is not limited thereto. In other embodiments, the memory controller may include more transceivers for communicating with the memory device, and the tree circuit may include more driving units for driving the transceivers.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A clock tree circuit, comprising:
a first clock source, generating a first signal; and
a first tree circuit, comprising:
a first driving unit, wherein the first driving unit has an input terminal for receiving the first signal, and an output terminal coupled to a first node;
a second driving unit, wherein the second driving unit has an input terminal coupled to the first node, and an output terminal coupled to a second node;
a third driving unit, wherein the third driving unit has an input terminal coupled to the first node, and an output terminal coupled to a third node;
a fourth driving unit, wherein the fourth driving unit has an input terminal coupled to the second node, and an output terminal;
a fifth driving unit, wherein the fifth driving unit has an input terminal coupled to the third node, and an output terminal; and
a metal connection element, coupled between the second node and the third node, and configured as a short-circuited element.

2. The clock tree circuit as claimed in claim 1, wherein the metal connection element is configured to reduce clock skew and clock jitter in the first tree circuit.

3. The clock tree circuit as claimed in claim 1, wherein the first tree circuit further comprises:
a sixth driving unit, wherein the sixth driving unit has an input terminal coupled to the second node, and an output terminal; and
a seventh driving unit, wherein the seventh driving unit has an input terminal coupled to the third node, and an output terminal.

4. The clock tree circuit as claimed in claim 3, wherein the first driving unit, the second driving unit, the third driving unit, the fourth driving unit, the fifth driving unit, the sixth driving unit, and the seventh driving unit are implemented with buffers and/or inverters.

5. The clock tree circuit as claimed in claim 1, wherein a width of the metal connection element is from 2 to 10 times greater than a minimum metal width in a process for manufacturing the clock tree circuit.

6. The clock tree circuit as claimed in claim 1, wherein the first tree circuit further comprises:
one or more metal shielding elements, disposed adjacent to the metal connection element.

7. The clock tree circuit as claimed in claim 6, wherein spacing between the metal connection element and each metal shielding element is from 2 to 10 times greater than a minimum metal width in a process for manufacturing the clock tree circuit.

8. The clock tree circuit as claimed in claim 6, wherein the first tree circuit further comprises:
a plurality of additional metal shielding elements; and
a plurality of via elements, wherein the additional metal shielding elements are coupled through the via elements to the metal shielding elements, so as to form a closed loop structure for surrounding the metal connection element.

9. The clock tree circuit as claimed in claim 1, further comprising:
a first independent power source, supplying a part or a whole of the first tree circuit.

10. The clock tree circuit as claimed in claim 1, wherein the clock tree circuit is applied to a memory device, and the first signal outputted by the first clock source is a data strobe signal (DQS).

11. The clock tree circuit as claimed in claim 1, further comprising:
a second clock source, generating a second signal; and
a second tree circuit, disposed adjacent to the first tree circuit, and receiving the second signal, wherein the second tree circuit is similar or identical to the first tree circuit.

12. The clock tree circuit as claimed in claim 11, further comprising:
a first independent power source, supplying a part or a whole of the first tree circuit; and
a second independent power source, supplying a part or a whole of the second tree circuit.

13. A memory controller, comprising:
a first tree circuit, comprising:
a first driving unit, wherein the first driving unit has an input terminal for receiving a first data strobe signal (DQS), and an output terminal coupled to a first node;
a second driving unit, wherein the second driving unit has an input terminal coupled to the first node, and an output terminal coupled to a second node;
a third driving unit, wherein the third driving unit has an input terminal coupled to the first node, and an output terminal coupled to a third node;
a fourth driving unit, wherein the fourth driving unit has an input terminal coupled to the second node, and an output terminal;
a fifth driving unit, wherein the fifth driving unit has an input terminal coupled to the third node, and an output terminal; and
a metal connection element, coupled between the second node and the third node, and configured as a short-circuited element; and
a plurality of first transceivers, transmitting or receiving a plurality of first bits, wherein the first transceivers are driven by the first tree circuit.

14. The memory controller as claimed in claim 13, wherein the metal connection element is configured to reduce clock skew and clock jitter in the first tree circuit.

15. The memory controller as claimed in claim 13, wherein the first tree circuit further comprises:
a sixth driving unit, wherein the sixth driving unit has an input terminal coupled to the second node, and an output terminal; and
a seventh driving unit, wherein the seventh driving unit has an input terminal coupled to the third node, and an output terminal.

16. The memory controller as claimed in claim 15, wherein the first driving unit, the second driving unit, the third driving unit, the fourth driving unit, the fifth driving unit, the sixth driving unit, and the seventh driving unit are implemented with buffers and/or inverters.

17. The memory controller as claimed in claim 13, wherein a width of the metal connection element is from 2 to 10 times greater than a minimum metal width in a process for manufacturing the memory controller.

18. The memory controller as claimed in claim 13, wherein the first tree circuit further comprises:
one or more metal shielding elements, disposed adjacent to the metal connection element.

19. The memory controller as claimed in claim 18, wherein spacing between the metal connection element and each metal shielding element is from 2 to 10 times greater than a minimum metal width in a process for manufacturing the memory controller.

20. The memory controller as claimed in claim 18, wherein the first tree circuit further comprises:
a plurality of additional metal shielding elements; and
a plurality of via elements, wherein the additional metal shielding elements are coupled through the via elements to the metal shielding elements, so as to form a closed loop structure for surrounding the metal connection element.

21. The memory controller as claimed in claim 13, further comprising:
a first independent power source, supplying a part or a whole of the first tree circuit.

22. The memory controller as claimed in claim 13, further comprising:
a second tree circuit, disposed adjacent to the first tree circuit, and receiving a second data strobe signal (DQS), wherein the second tree circuit is similar or identical to the first tree circuit; and
a plurality of second transceivers, transmitting or receiving a plurality of second bits, wherein the second transceivers are driven by the second tree circuit.

23. The memory controller as claimed in claim 22, further comprising:
a first independent power source, supplying a part or a whole of the first tree circuit; and
a second independent power source, supplying a part or a whole of the second tree circuit.

* * * * *